United States Patent [19]

Hennig

[11] Patent Number: 5,089,756
[45] Date of Patent: Feb. 18, 1992

[54] DEFLECTION DRIVER IN A VIDEO APPARATUS

[75] Inventor: Bruno E. Hennig, Zurich, Switzerland

[73] Assignee: RCA Thomson Licensing Corporation, Princeton, N.J.

[21] Appl. No.: 708,278

[22] Filed: May 31, 1991

Related U.S. Application Data

[63] Continuation-in-part of Ser. No. 481,426, Feb. 20, 1990, abandoned.

[30] Foreign Application Priority Data

Apr. 21, 1989 [GB] United Kingdom ............... 8909116

[51] Int. Cl.$^5$ .......................... H09G 1/04; H01J 29/70
[52] U.S. Cl. ........................ 315/387; 315/408
[58] Field of Search .................... 315/408, 405, 387

[56] References Cited

U.S. PATENT DOCUMENTS

| | | |
|---|---|---|
| 3,174,073 | 3/1965 | Massman et al. . |
| 3,435,280 | 6/1965 | Havn ................................ 315/387 |
| 3,441,791 | 4/1969 | Beck ................................ 315/408 |
| 3,466,496 | 9/1969 | Geller et al. . |
| 3,512,040 | 5/1970 | Lester . |
| 4,028,589 | 6/1977 | Verbeij ............................... 315/408 |
| 4,323,825 | 4/1982 | Hayes ................................ 315/387 |
| 4,647,823 | 3/1987 | Luz . |
| 4,734,771 | 3/1988 | Lendaro et al. . |

OTHER PUBLICATIONS

Schematic diagram of a Chassis B-6510 television receiver Appollo 2550.

Primary Examiner—Gregory C. Issing
Attorney, Agent, or Firm—Joseph S. Tripoli; Joseph J. Laks; Sammy S. Henig

[57] ABSTRACT

A driver stage of a horizontal deflection output transistor includes a transformer having a first winding coupled to an input signal at a horizontal deflection frequency, a second winding coupled across a base-emitter junction of the output transistor and a third winding coupled to the emitter of and in series with the output transistor. The third winding couples the emitter current to the base of the output transistor for supplying a substantial portion of the base current during the second half of trace.

21 Claims, 8 Drawing Sheets

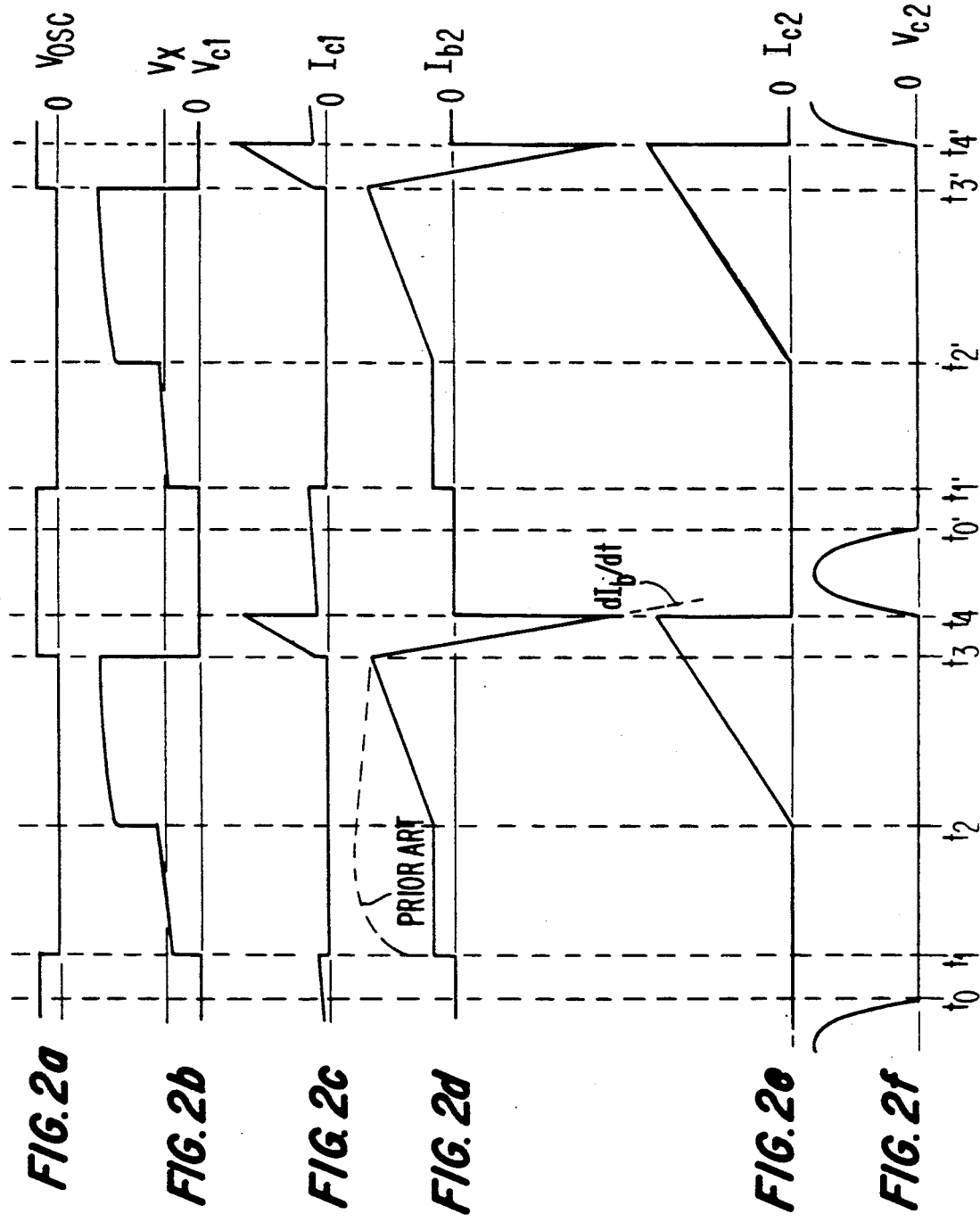

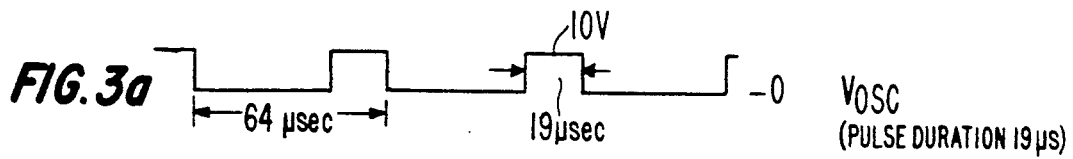
FIG. 3a $V_{OSC}$ (PULSE DURATION 19 μs)
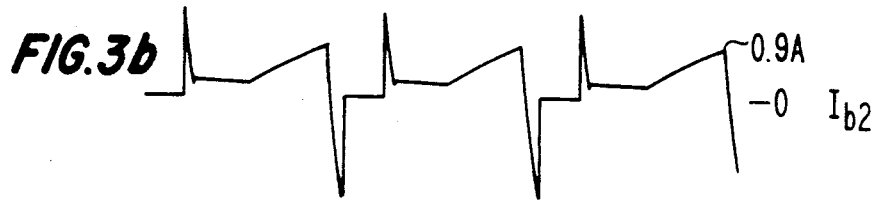
FIG. 3b $I_{b2}$
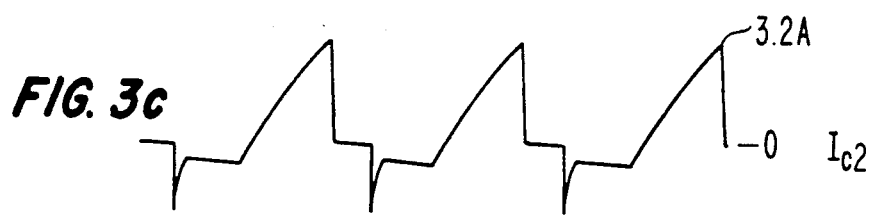
FIG. 3c $I_{c2}$
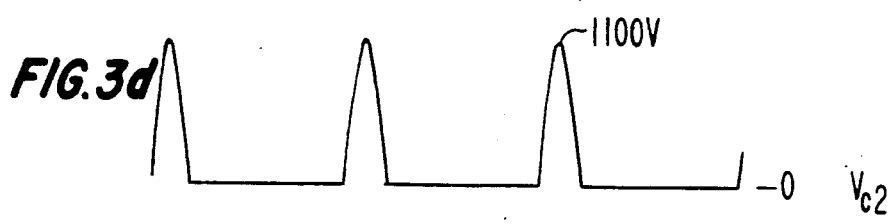
FIG. 3d $V_{c2}$
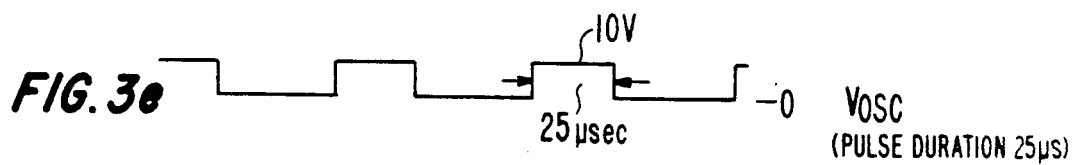
FIG. 3e $V_{OSC}$ (PULSE DURATION 25 μs)
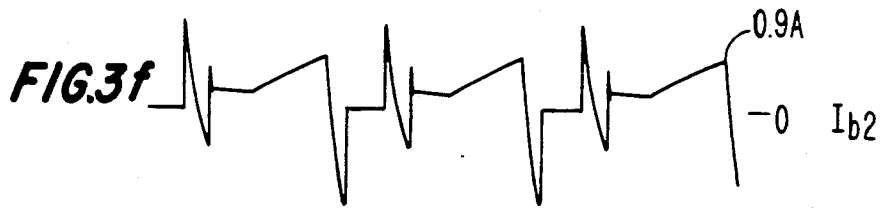
FIG. 3f $I_{b2}$

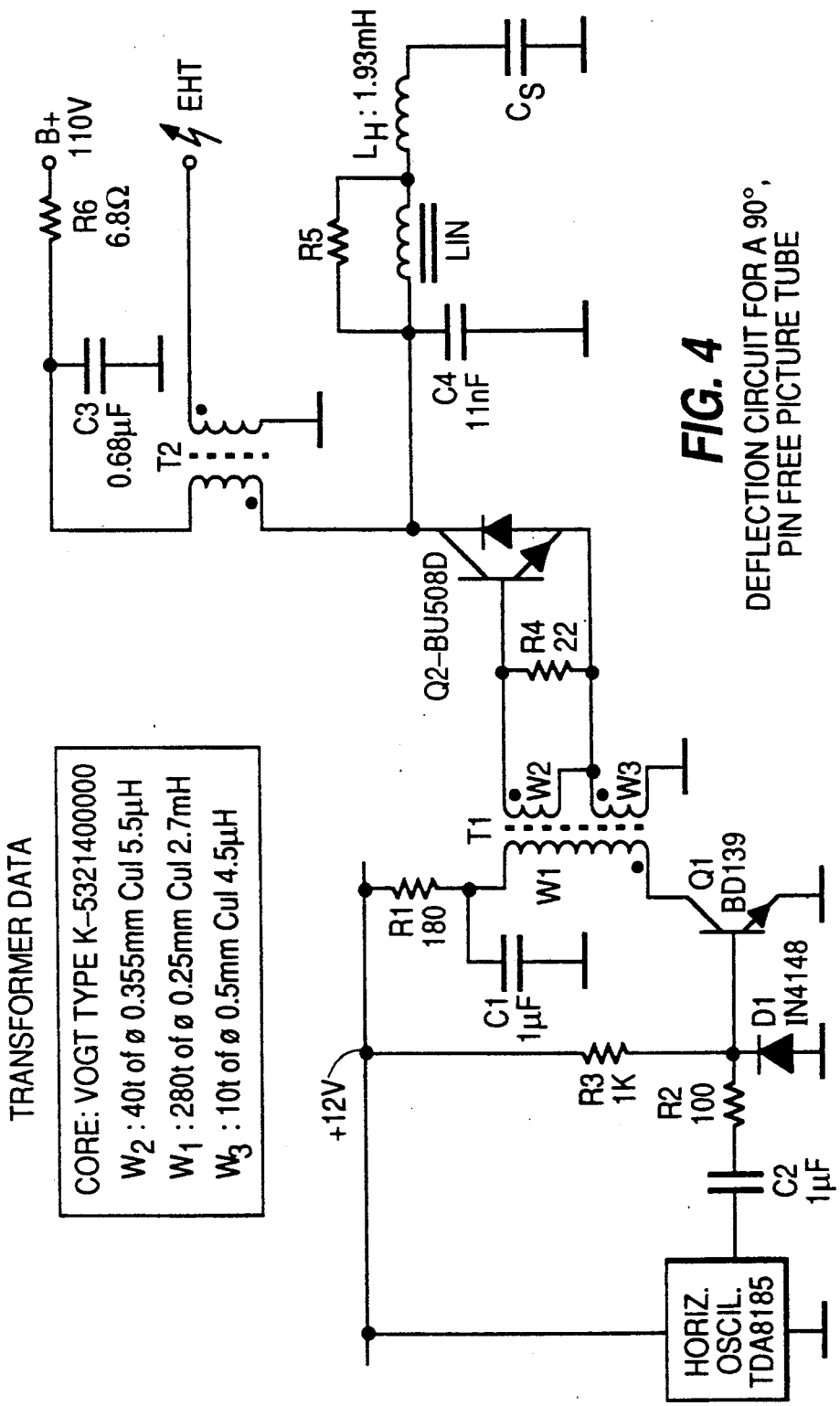

DEFLECTION CIRCUIT FOR A 110°, PICTURE TUBE USING THE DIODE MODULATOR

FIG. 6 APPLICATION FOR 110° PICTURE TUBES USING THE SWITCHED E-W RASTER CORRECTION CIRCUIT

DEFLECTION DRIVER IN A VIDEO APPARATUS

This is a continuation-in-part of application Ser. No. 481,426, filed Feb. 20, 1990, abandoned Aug. 22, 1991.

The invention relates to a transistor drive circuit for a deflection circuit output stage of a cathode ray tube (CRT) in a television or other such display device. In particular, the invention relates to a drive circuit of a horizontal deflection circuit output stage in which a switching output transistor, operating in a switching mode, produces a deflection current in a horizontal deflection winding of the CRT.

One prior art horizontal deflection circuit that is used in various color television receivers includes a driver or drive stage having a transformer coupled to a control terminal of the output transistor of the deflection circuit output stage. The driver stage further includes a second switching transistor having a collector electrode that is coupled to a primary winding of the transformer. When the switching transistor of the driver stage is conductive, magnetic energy is stored in the inductance of the primary winding. At the same time, a transformer coupled voltage developed across a secondary winding of the transformer causes the switching output transistor of the output stage, driven by the voltage developed in the secondary winding of the transformer, to be non-conductive. When the second switching transistor of the driver stage becomes non-conductive, the stored magnetic energy in the coupling transformer produces, in a flyback manner, a winding current that flows in the secondary winding of the coupling transformer to form a forward base current. The winding current turns on the switching output transistor and maintains it turned-on until substantially the end of horizontal trace. Such forward base current is produced entirely from the magnetic energy previously stored in the transformer. Therefore, the forward base current is, disadvantageously, a downramping current during the second half of trace; whereas, the deflection current and the collector current of the output transistor are upramping.

The deflection circuit output transistor is typically a bipolar transistor that is driven hard enough to stay well in saturation until the end of trace, when the deflection current is at its peak. However, any excess drive current may, disadvantageously, lead to an increase in the turn-off time and, hence, to an increase in turn-off losses of the deflection circuit output transistor. This problem is aggravated at higher scan rates.

Because the entire energy required for generating the forward base current that drives the output transistor is produced in the aforementioned prior art driver stage, power losses in the driver stage may be, disadvantageously, high. Furthermore, as indicated before, the forward base current becomes increasingly smaller towards the end of the second half of trace; whereas, the forward base current requirement of the output transistor becomes increasingly larger when the collector current is upramping. Moreover, any variation of the duty cycle of the second switching transistor may, disadvantageously, affect the value of the forward base current.

It may be desirable to produce a current in the secondary winding of the transformer having an upramping waveform during the second half of trace that tracks the upramping change in the collector current. In this way, the forward base current is upramping during the second half of trace.

In accordance with a feature of the invention, a driver transistor of the driver stage produces stored magnetic energy in the coupling transformer. The stored magnetic energy supplies the forward base current that drives the deflection output transistor into saturation prior to the beginning time of the upramping collector current in the output transistor. After the collector current in the output transistor begins increasing in an upramping manner, the major part of the base current is provided by transformer coupling in a feedback manner the upramping deflection current via the transformer to the base of the output transistor to form the upramping base current.

Advantageously, the transformer produces an upramping shaped base current drive waveform that is desirable because of the upramping collector current. Furthermore, the feedback arrangement improves the switching conditions of the deflection output transistor, resulting in an overall lower power dissipation and in an increased reliability.

A television deflection apparatus, embodying an aspect of the invention, includes a deflection winding and a first switching transistor coupled to the deflection winding and responsive to a switching control signal developed at a control terminal of the first switching transistor for generating a deflection current in the deflection winding. During a portion of a given deflection cycle, each of the deflection current and a transistor current, flowing in main current path of the first switching transistor, varies in a ramping manner. The control signal varies in a ramping manner during the aforementioned portion of the deflection cycle, as determined by a rate of change of one of the transistor and deflection currents.

FIGS. 2a–2f illustrate waveforms useful for explaining the operation of the circuit of FIG. 1;

FIGS. 3a–3f illustrate additional waveforms useful for explaining the operation of the circuit of FIG. 1;

FIG. 4 illustrates a driver stage similar to that in FIG. 1 that is used for driving a horizontal output stage of a CRT having a 90° deflection angle;

Figure 1:
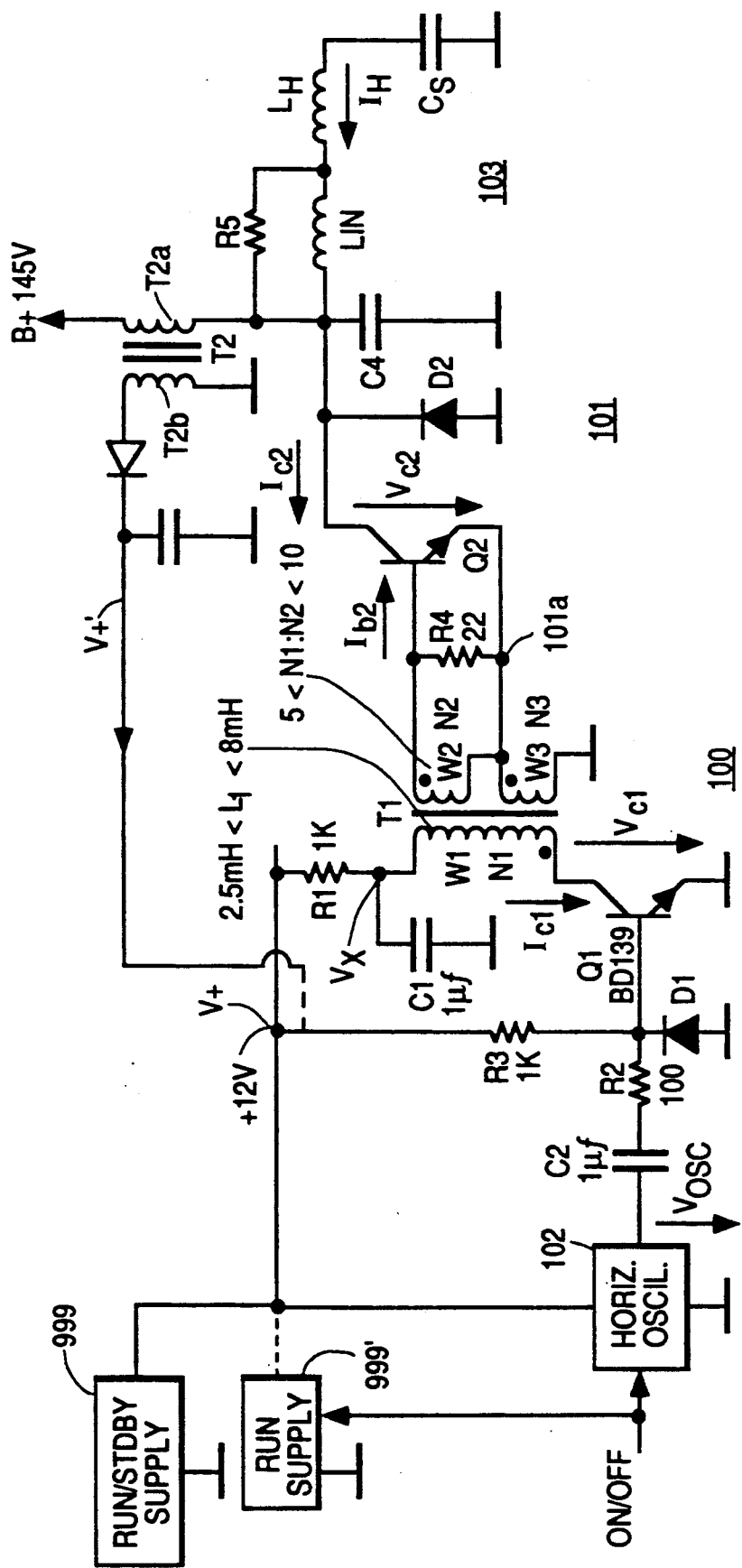
FIG. 1 illustrates a driver stage, embodying an aspect of the invention, of a horizontal deflection circuit output stage.

FIG. 1 illustrates a driver stage 100, embodying an aspect of the invention, for driving a switching output transistor Q2 of a horizontal deflection circuit output stage 101 of a television receiver. A conventional horizontal oscillator 102 that produces, during normal power-on operation, an output signal $V_{OSC}$ at a horizontal frequency $f_H$ that is approximately 16 KHZ during normal power-on operation is coupled via a capacitor C2 and a resistor R2 to a base electrode of a driver transistor Q1. A diode D1 coupled to the base of transistor Q1 prevents the base voltage from becoming excessively negative. A collector of transistor Q1 is coupled to one end terminal of a primary winding W1 of a coupling transformer T1. The other end terminal of winding W1 is by passed to ground by a filter capacitor C1 and coupled via a current limiting resistor R1 to a source of supply voltage V+ such that resistor R1 and capacitor C1 form a ripple filter.

A secondary winding W2 of transformer T1 is coupled across a base-emitter junction of transistor Q2 and across a resistor R4. A junction terminal 101a that is coupled at a junction of winding W2, resistor R4 and the emitter of transistor Q2 is coupled to one end terminal of a winding W3 of transformer T1. The other end terminal of winding W3 is coupled to ground.

The collector of transistor Q2 is coupled to a damper diode D2 of a conventional horizontal deflection circuit 103. Circuitry 103 further includes a horizontal deflection winding $L_H$, a retrace capacitor C4, a trace capacitor $C_S$, a linearity inductor $L_{LIN}$, and a linearity resistor $R_5$ that are coupled in a well-known manner. A supply voltage B+ is coupled to circuit 103 via a winding T2a of a transformer T2. During retrace, circuitry 103 forms a retrace resonant circuit.

FIGS. 2a-2f and 3a-3f illustrate waveforms useful for explaining the operation of the circuit of FIG. 1. Similar symbols and numerals in FIGS. 1 and 2a-2f and 3a-3f indicate similar items or functions.

In operation, driver transistor Q1 of FIG. 1 is conductive as a result of a signal $V_{OSC}$ of FIG. 2a being positive until time $t_1$ of FIG. 2c that causes transistor Q2 to be nonconductive. The magnetic energy supplied by a collector current $I_{c1}$ of transistor Q1 is stored in winding W1 of FIG. 1. When transistor Q1 is turned off, during interval $t_1$-$t_3$ of FIG. 2a, the stored energy produces in winding W2 of FIG. 1 a forward base current $I_{b2}$ of transistor Q2. Current $I_{b2}$ is sufficient to turn on deflection transistor Q2 and to maintain it in saturation prior to time $t_2$ of FIG. 2e.

The amplitude of current $I_{b2}$ of FIG. 2d remains substantially constant during the first half of trace, interval $t_1$-$t_2$. This is so because windings W2 and W3 are short circuited by the low impedance of the base-collector junction of transistor Q2 that is coupled in series with the forward biased damper diode D2. At time $t_2$, a deflection current $I_H$ in deflection winding $L_H$ of FIG. 1 reversed polarity. As a result of current reversals in deflection winding $L_H$ of circuitry 103 of FIG. 1 and in a fly back transformer winding T2a collector current $I_{c2}$ starts flowing in transistor Q2 of FIG. 1 after time $t_2$ of FIG. 2e in an upramping manner.

In accordance with a feature of the invention, upramping collector current $I_{c2}$ that flows as an emitter current through winding W3 of FIG. 1 is transformer coupled through current transformer T1 to the base of transistor Q2 in accordance with a turns ratio N2:N3 of windings W2 and W3, respectively. Transformer coupled current $I_{c2}$ provides a major portion of upramping forward base current $I_{b2}$ of transistor Q2, during the second half of trace, interval $t_2$-$t_3$, when collector current $I_{c2}$ is upramping. The base-emitter junction of transistor Q2 forms a very low impedance across winding W2. Therefore, a performance similar to that of an ideal current transformer operation is obtained in transformer T1 for coupling the current in winding W3 to winding W2. The required turns ratio is selected in accordance with a current gain parameter $h_{FE}$ of transistor Q2. For example, when parameter $h_{FE}$ is equal to 4, the selected turns ratio, N2:N3, may be equal to 4. The turn ratio between windings W2 and W3 is determined by the current gain $h_{FE}$ of transistor Q2. Should the core selected for transformer T1 provide tight magnetic coupling, such as for example, when an E-type core is utilized, such turn ratio may be equal to the value of current gain $h_{FE}$ of transistor Q2. On the other hand, if the magnetic coupling is not tight, a lower turn ratio may be chosen.

Upramping base current that is proportional to current $I_{c2}$ is induced in winding W2 of FIG. 1 only after time $t_2$ of FIG. 2d. Transformer coupled upramping current $I_{c2}$ of FIG. 2e is added to the aforementioned current already provided by the stored magnetic energy in transformer T1 to form upramping base current $I_{b2}$. The rate of change of current $I_{b2}$ of FIG. 1, advantageously, closely tracks the base current requirement of deflection transistor Q2 having upramping collector current $I_{c2}$. Therefore, the conductivity of transistor Q2 changes in a manner that maintains transistor Q2 in saturation without significantly overdriving the base of transistor Q2, during the second half of trace interval, $t_2$-$t_3$. In contrast, in the aforementioned prior art driver stage, a base current that is provided is downramping during trace. Consequently, the base current may be unnecessarily high during an interval that is analogous to interval $t_1$-$t_3$ of FIG. 2d, as shown in dashed line waveform of FIG. 2d.

Cut-off of transistor Q2 of FIG. 1 is initiated at time $t_3$ of FIG. 2e, when transistor Q1 of FIG. 1 is switched into saturation. The level of collector voltage $V_{c1}$ of FIG. 2b at time $t_3$ and the turns ratio between windings W1 and W2 of FIG. 1 determine the amplitude of the negative turn-off voltage developed across the base-emitter junction of transistor Q2. This voltage and the leakage inductance of transformer T1 determine the negative slope $dI_{b2}/dt$ of FIG. 2d during a storage or turn-off delay interval $t_3$-$t_4$ of transistor Q2 of FIG. 1. By selecting a proper turns-ratio of windings W1 and W2, that is, for example, between 5 and 10, the desired negative slope $dI_{b2}/dt$ for optimizing the base carrier discharge can be obtained. This is so because the turn ratio between windings W1 and W2 of transformer T1 determines the leakage inductance of transformer T1. The waveform of collector current $I_{c1}$ of FIG. 2c shows the peak negative base current used for turning off transistor Q2 at time $t_4$ of FIG. 2c, the start of horizontal retrace.

During a substantial portion of the second half of trace, interval $t_2$-$t_3$ of FIG. 2d, the increasing forward base current causes an increasing base-emitter voltage of transistor Q2 of FIG. 1, which is transformer coupled across winding W3. This transformer coupled voltage is coupled across winding W3 and is coupled in series with deflection transistor Q2. Such series coupled voltage, however, is negligibly small. Therefore, the voltage across winding W3 does not appreciably impair the linearity of the deflection current and of current $I_{c2}$ of FIG. 2c.

Advantageously, resistor R3 of FIG. 1 serves to supply a base current that drives transistor Q1 into saturation immediately after oscillator 102 is turned off or made inoperative. Oscillator 102 may be turned off in response to an output signal ON/OFF of a remote receiver, not shown, that is used for turning off the television receiver to operate the receiver in a stand-by mode operation. Advantageously, by being conductive, transistor Q1 prevents self-oscillation of deflection circuit output stage 101 during the transition to standby mode operation. Such self oscillation might have occurred in the absence of drive pulses from the oscillator 102 and might have caused harmful high current and voltage peaks in output stage 101. Such high peaks might have occurred if driver transistor Q1 were not held in conduction as long as energy is circulating in deflection circuit output stage 101 following the transition to standby mode. The stored energy in the driver transformer might have caused output transistor Q2 to turn on, but not to turn off properly. Transistor Q2 might not turn off properly because the negative going slope of base current $I_{b2}$, that in normal operation causes transistor Q2 to turn off, is not produced after oscillator 102 ceases operation. By maintaining transistor Q1 conductive during the transition to standby mode of operation, any lengthening of the last deflection cycle, occurring after oscillator 102 ceases operation, is avoided. Such lengthening, disadvantageously, might have overstressed deflection transistor Q2.

Resistor R1 limits the collector current and power dissipation in transistor Q1, during the transition to stand-by mode of operation. The use of a rather high value for resistor R1 such as, for example, 1K ohm is, advantageously, possible. This is so because driver transistor Q1 operates at a lower power level than the analogous transistor in the aforementioned prior art circuit. Consequently, the collector current in transistor Q1, that is in saturation during a transition to standby mode, will not harm transistor Q1. Also, by having resistor R1 with the high value, collector current and power dissipation in transistor Q1 are limited in the case of a failure in oscillator 102.

Advantageously, a main portion of forward base current $I_{b2}$ of deflection transistor Q2 is derived from its collector current $I_{c2}$ and rises linearly. In contrast, in the aforementioned prior art driver circuit, the entire drive current is supplied by the energy stored in the driver transformer. Therefore, a lower dissipation occurs in driver stage 100 of FIG. 1. The result is that the required level of voltage V+ may be, advantageously, lower than in such prior art driver circuit.

Controlling the wave shape and peak amplitude of base current $I_{b2}$ in a precise manner is desirable to insure saturation of deflection transistor Q2 during the second half of trace. This feature, advantageously, is achieved in the circuit of FIG. 1 by transformer coupling the emitter current of transistor Q2 that is linearly uprampoing via winding W3. In comparison, in the aforementioned prior art circuit, an R-C damping network coupled across a primary winding of the coupling transformer is typically used for controlling the waveform of the drive current. However, tolerances of the R-C damping network produce, disadvantageously, a corresponding tolerance spread in the values of the drive current.

FIGS. 3a an 3c illustrate waveforms of signal $V_{OSC}$ of FIG. 1 having different duty cycles and the same frequency and the resulting waveforms of base current $I_{b2}$ of FIGS. 3b and 3f, respectively. As can be seen, the peak amplitude of base current $I_{b2}$ is the same in both cases. The collector current $I_{c2}$ of FIG. 3c is also unaffected by the duty cycle variation of signal $V_{OSC}$.

Figure 5:
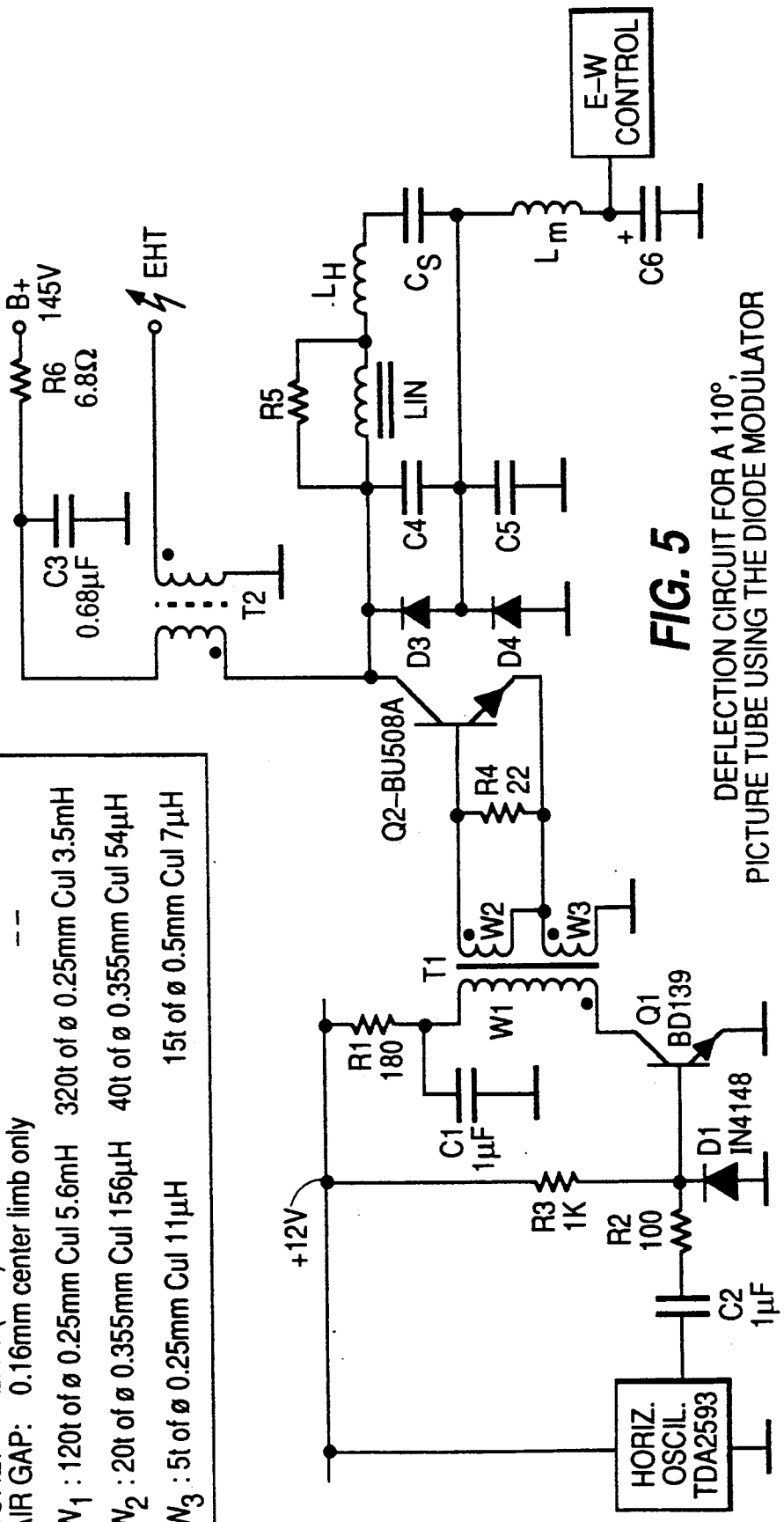
FIG. 5 illustrates a driver stage similar to that in FIG. 1 that is used for driving a horizontal output stage having a diode modulator.

FIG. 4 illustrates a deflection circuit for a pin-free 90° CRT that includes a driver stage similar to that shown in FIG. 1. The corresponding waveforms are shown in FIGS. 7a-7d. Similarly, FIG. 5 illustrates a deflection circuit for a 110° CRT using a diode modulator. The corresponding waveforms are shown in FIGS. 2a-2f and 3a-3f.

Figure 6:
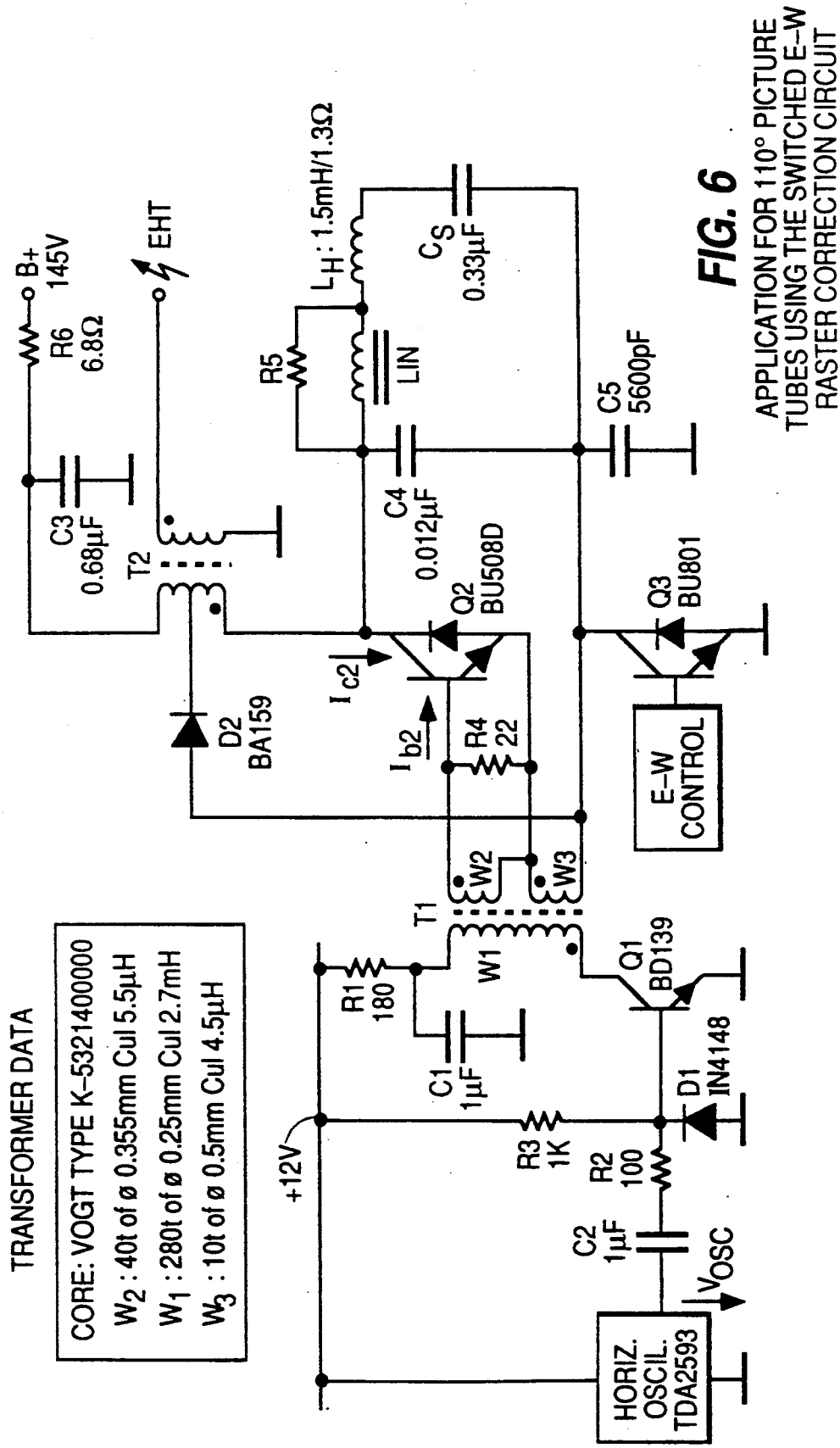
FIG. 6 illustrates a driver stage similar to that in FIG. 1 that is used for driving a horizontal output stage having a switched E-W raster correction circuit.

FIG. 6 illustrates a deflection circuit for a 110° CRT using a switched East-West raster correction circuit. The applicable waveforms are shown in FIGS. 7a-7d. Similar symbols and numerals in FIGS. 1, 2a-2f, 3a-3f, 4-6 and 7a-7d indicate similar items or functions.

Figure 7:
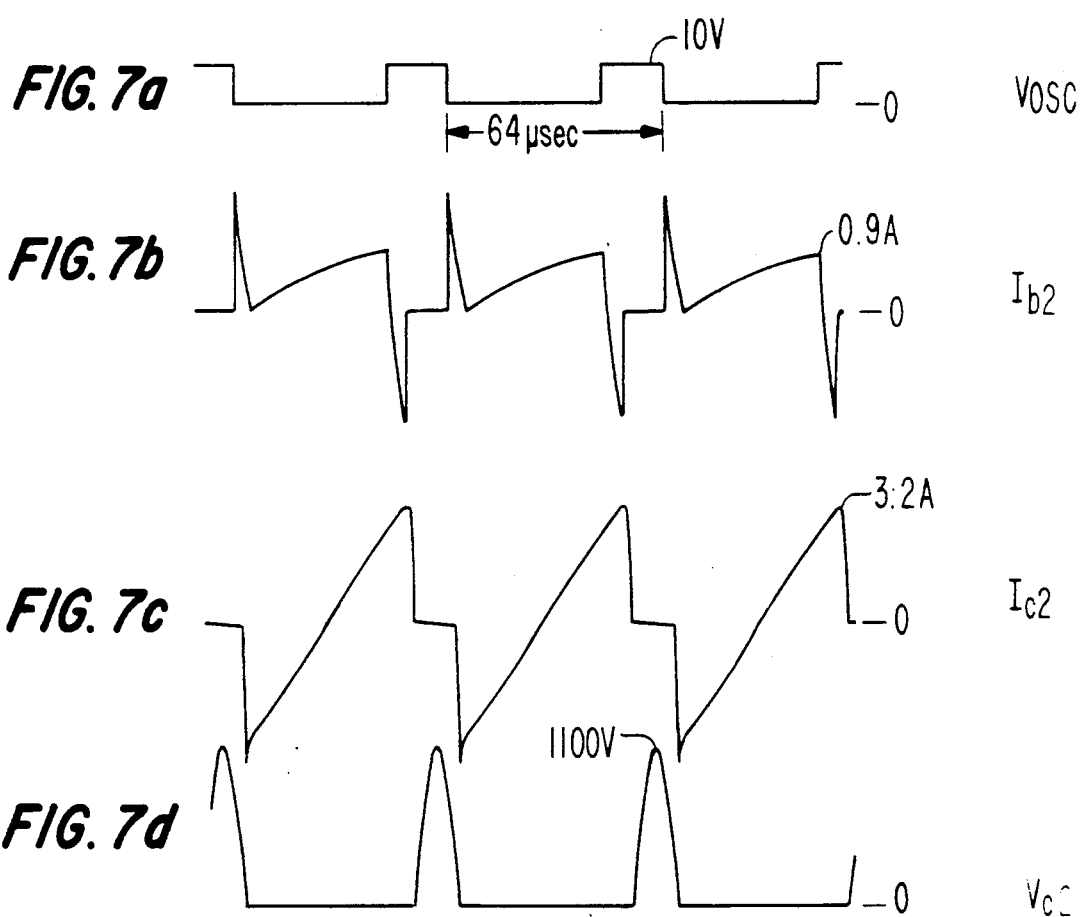
FIGS. 7a–7d illustrate waveforms useful for explaining the operation of each of the circuits of FIGS. 4 and 6.

The reason that the waveforms of FIGS. 7b and 7c are different from those in FIGS. 2d and 2e, respectively, and from those in FIGS. 3b and 3c, respectively, is that in FIGS. 4 and 6 the damper diode is coupled across transistor Q2. The damper diode of FIG. 4, for example, forms with transistor Q2 an integrated circuit. This results in the deflection current in winding $L_H$ to flow also through winding W3, during the first half of trace. In contrast, in FIG. 1, deflection current $I_H$ does not flow through winding W3 during the first half of trace because the cathode of diode D2 is coupled to ground directly and not via winding W3. Transformer T1 of FIG. 6, may, preferably, have a lower primary winding inductance and a slightly higher turns ratio between windings W2 and W3 than in the circuit of FIG. 1 having a discrete damper diode D2.

Voltage V+ of FIG. 1 may be generated by a RUN/STANDBY power supply 999 that generates voltage V+ during the normal run mode operation, during the aforementioned transition to standby mode operation and also throughout the standby mode operation. Because resistor R1 is large, the power dissipation in resistor R1, occurring as a result of such continuous conduction of transistor Q2, and power demand from supply 999 are, advantageously, small, throughout the standby mode operation. Alternatively, voltage V+ may be generated in a supply 999' that turns off voltage V+, after the aforementioned transition interval.

In an arrangement where initiating standby mode of operation is obtained by switching off voltage V+ of FIG. 1, resistor R3 may, preferably, be coupled to a positive voltage V+', as shown in broken line. Voltage V+' is derived from a secondary winding T2b of a flyback transformer T2, rectified by a diode 77 and filtered by a capacitor 78. This will ensure a fail safe transition from normal to standby operation by maintaining transistor Q1 in saturation during the aforementioned transition to standby mode operation.

Figure 8:
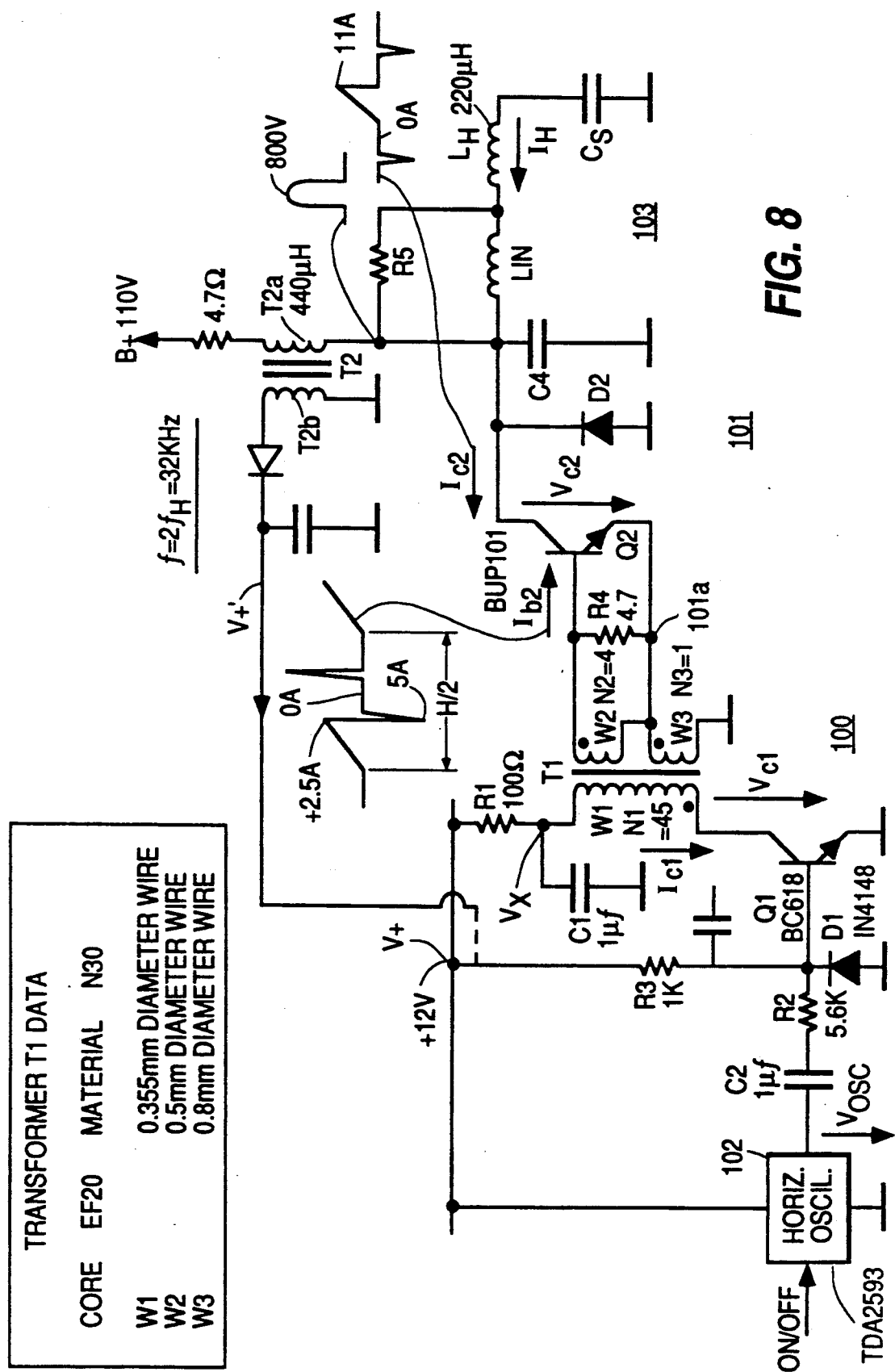
FIG. 8 illustrates a driver stage of a deflection circuit operating at 32 KHZ.

FIG. 8 illustrates a deflection circuit for a EUREKA CRT operating at a deflection frequency of $2 \times f_H$ that is approximately 32 KHZ. Similar symbols and numerals in FIGS. 1 and 8 indicate similar items or functions. The driver stage of FIG. 8 is similar to that shown in FIG. 1.

As shown in FIGS. 1, 4-6 and 8, driver stage 100 can be easily adapted to many types of horizontal output transistors and to different yoke impedances and is well suited for higher scan rate applications. Overall, the component count required for producing the uprampoing base current is reduced relative to that required in some prior art circuits. Overall, producing the uprampoing base current improves the efficiency of the driver stage. The well controlled base driver waveform produces a lower dissipation in the output stage and an increased reliability.

What is claimed is:
1. A television deflection apparatus, comprising:
   a deflection winding;
   a first switching transistor coupled to said deflection winding and responsive to a switching control signal developed at a control terminal of said first switching transistor for generating a transistor current in a main current path of said transistor and a deflection current in said deflection winding such that, during a trace interval of a given deflection cycle, each of said deflection and transistor currents varies in a ramping manner;
a source of an input signal at a frequency that is related to a deflection frequency; and
a transformer having a first winding that is responsive to said input signal, a second winding that is responsive to one of said transistor and deflection currents and a third winding having a first terminal that is coupled between said second winding and said transistor and a second terminal that is coupled to said control terminal for generating said control signal that varies in a ramping manner during said trace interval of said deflection cycle at a rate of change determined by a rate of change of said one of said transistor and deflection currents.

2. An apparatus according to claim 1 wherein said deflection current flows also in said main current path.

3. An apparatus according to claim 1 wherein said first switching transistor comprises a bipolar transistor and wherein said third winding is coupled to a base electrode of said first switching transistor for generating said control signal as a ramping base current during a second half of said trace interval.

4. An apparatus according to claim 1 wherein said transformer applies said deflection current to a base electrode of said first switching transistor to produce a base current that varies in the same sense as said current in said main current path of said first switching transistor, during a second half of said trace interval.

5. An apparatus according to claim 1 further comprising, first switching means coupled in parallel with said first switching transistor for conducting at least a substantial portion of said deflection current in a manner that by passes said first switching transistor during a first portion of said trace interval of said deflection cycle such that during a second portion of said trace interval, said at least substantial portion of said deflection current is conducted, instead, in said first switching transistor, wherein said said control signal is developed in said control terminal of said first switching transistor prior to an instant within said trace interval when said deflection current is switched over from being conducted in said first switching means to being conducted in said first switching transistor.

6. An apparatus according to claim 1 wherein said transformer couples said input signal to said control terminal via said first winding of said transformer to initiate a turn-off operation in said first switching transistor, wherein said deflection current is coupled to said second winding of said transformer for transformer coupling said deflection current to said control terminal of said first switching transistor via said second winding during a first portion of said trace interval.

7. An apparatus according to claim 6 wherein said second winding of said transformer is coupled in a current path of said transistor current.

8. An apparatus according to claim 7 wherein said first switching transistor comprises a bipolar transistor and wherein said second winding is coupled to an emitter electrode thereof such that said emitter electrode thereof is interposed between said deflection winding and said second winding.

9. An apparatus according to claim 8 wherein said emitter electrode is interposed between said second and third windings.

10. An apparatus according to claim 6 further comprising, a second switching transistor that is coupled to said first winding of said transformer for producing in said transformer a first portion of said control signal in a flyback manner and for producing a second portion of said control signal that initiates a turn-off operation in said first switching transistor.

11. An apparatus according to claim 1 wherein said deflection current is at a substantially higher frequency than 16 KHZ.

12. A television deflection apparatus, comprising:
a deflection retrace resonant circuit including a deflection winding and a retrace capacitance;
a first switching transistor responsive to a control signal and coupled to said retrace resonant circuit for performing a switching operation that generates a deflection current in said deflection winding and a first current that varies in a ramping manner during a trace portion of a given deflection cycle and that flows between a pair of main current conducting terminals of said transistor;
a source of an input signal at a frequency that is related to a deflection frequency;
a transformer having a first winding that is coupled to said source of said input signal, a second winding that is coupled to a main current conducting terminal of said transistor and a third winding that is coupled to a control terminal of said first switching transistor such that a first portion of said first current that flows between said pair of main current conducting terminals flows in said second winding and a second portion of said first current flows in said third winding for transformer coupling each of said input signal and first current to said control terminal of said first switching transistor to develop said control signal at said control terminal, said control signal having a frequency that is determined by said input signal and a level that varies in accordance with the ramping manner variation of said first current during said trace portion of said deflection cycle.

13. A deflection apparatus according to claim 12 further comprising a second switching transistor having a control terminal that is responsive to said input signal and a main current conducting terminal that is coupled to said first winding for storing magnetic energy in said transformer during a second portion of said deflection cycle when said second switching transistor is conductive and for generating a current in said third winding of said transformer in a flyback manner during a portion of said deflection cycle when said second switching transistor is nonconductive.

14. An apparatus according to claim 13 wherein said third winding current is coupled to a base electrode of said first switching transistor for maintaining said first switching transistor conductive prior to a second half of said trace interval of said deflection cycle such that during said second half of said trace interval said base current is produced mainly by a current that is coupled via said second winding.

15. A television deflection apparatus, comprising:
a deflection retrace resonant circuit including a deflection winding and a retrace capacitance;
a first switching transistor responsive to a control signal and coupled to said retrace resonant circuit for performing a switching operation that generates a deflection current in said deflection winding and a first signal that varies in a ramping manner during a trace portion of a given deflection cycle when said first switching transistor conducts a first current between a pair of main current conducting terminals thereof;

a source of an input signal at a frequency that is related to a deflection frequency;

a transformer having a first winding that is responsive to said input signal and having a second winding that is coupled to said first signal and a third winding that is coupled to a control terminal of said first switching transistor for transformer coupling each of said input and first signals to said control terminal of said first switching transistor to develop said control signal at said control terminal, said control signal having a frequency that is determined by said input signal and a level that varies in accordance with the ramping manner variation of said first signal during said trace portion of said deflection cycle;

a second switching transistor having a control terminal that is responsive to said input signal and a main current conducting terminal that is coupled to said first winding for storing magnetic energy in said transformer during a second portion of said deflection cycle when said second switching transistor is conductive and for generating a current in said third winding of said transformer in a flyback manner during a portion of said deflection cycle when said second switching transistor is nonconductive; and means responsive to an on/off control signal for disabling said input signal to initiate a standby mode of operation and means coupled to said second switching transistor for maintaining said second switching transistor conductive during a transition to said standby mode of operation, thereby providing fail safe operation.

16. A television deflection apparatus, comprising:

a deflection retrace resonant circuit including a deflection winding and a retrace capacitance;

a first switching transistor responsive to a control signal and coupled to said retrace resonant circuit for performing a switching operation that generates a deflection current in said deflection winding;

a deflection oscillator for generating an input signal at a frequency that is related to a deflection frequency;

a driver stage responsive to said input signal for generating a drive signal;

a deflection driver transformer having a first winding that is coupled to said driver stage and is responsive to said drive signal, a second winding that is coupled to a control terminal of said first switching transistor and a third winding that is coupled in an emitter current path of said first switching transistor for transformer coupling, during a trace interval, each of said drive signal and emitter current to said control terminal of said first switching transistor to develop said control signal at said control terminal such that an emitter electrode of said transistor is coupled between said second and third windings.

17. A deflection apparatus according to claim 16 wherein winding polarities of said second and third windings is the same and that of said first winding is opposite thereto.

18. A television deflection apparatus, comprising:

a deflection retrace resonant circuit including a deflection winding and a retrace capacitance;

a first switching transistor responsive to a control signal at a frequency that is related to a deflection frequency and coupled to said retrace resonant circuit for performing a switching operation that generates a deflection current in said deflection winding;

a transformer having a first winding that is coupled to a control terminal of said first switching transistor for developing said control signal at said control terminal;

a source of an input signal at a frequency that is related to a deflection frequency; and a second switching transistor responsive to said input signal and coupled to a second winding of said transformer for generating a first current in said second switching transistor and in said second winding of said transformer that is transformer coupled via said transformer to said control terminal of said first switching transistor to develop said control signal at said control terminal in a run mode operation, said second switching transistor being responsive to an on/off control signal for maintaining said second switching transistor conductive, during a standby mode of operation, such that said first current flows in said second winding and in said transistor, during said standby mode of operation.

19. An apparatus according to claim 18 wherein said transformer includes a third winding that is coupled in a main current path of said first switching transistor for transformer coupling a current that flows in said main current path to said control terminal of said first switching transistor to develop said control signal at said control terminal, during a trace portion of a deflection cycle.

20. An apparatus according to claim 18 further comprising, a standby power supply that is coupled to a main current conducting terminal of said second switching transistor to supply a current that flows in said main current conducting terminal, throughout said standby mode of operation.

21. A television deflection apparatus, comprising:

a deflection retrace resonant circuit including a deflection winding and a retrace capacitance;

a first switching transistor responsive to a control signal at a frequency that is related to a deflection frequency and coupled to said retrace resonant circuit for performing a switching operation that generates a deflection current in said deflection winding;

a transformer having a first winding that is coupled to a control terminal of said first switching transistor for developing said control signal at said control terminal;

a source of an input signal at a frequency that is related to a deflection frequency; and a second switching transistor responsive to said input signal and coupled to a second winding of said transformer for generating a first current in said second switching transistor and in said second winding of said transformer that is transformer coupled via said transformer to said control terminal of said first switching transistor to develop said control signal at said control terminal in a run mode operation, said second switching transistor being responsive to an on/off control signal for maintaining said second switching transistor conductive, during a transition interval that precedes a standby mode of operation, such that said first current flows in said second winding and in said transistor, during said transition interval.

* * * * *